(12) United States Patent
Baek et al.

(10) Patent No.: US 11,092,841 B2
(45) Date of Patent: Aug. 17, 2021

(54) COLOR FILTER AND DISPLAY APPARATUS INCLUDING THE SAME

(71) Applicant: Samsung Display Co., Ltd., Yongin-si (KR)

(72) Inventors: Seungin Baek, Yongin-si (KR); Mira Gwon, Yongin-si (KR); Gunshik Kim, Yongin-si (KR); Youngeun Park, Yongin-si (KR); Junghwan Lee, Yongin-si (KR); Yunmo Chung, Yongin-si (KR); Sujin Choi, Yongin-si (KR); Younho Han, Yongin-si (KR); Jungbae Song, Yongin-si (KR); Daewoo Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 102 days.

(21) Appl. No.: 16/276,675

(22) Filed: Feb. 15, 2019

(65) Prior Publication Data

US 2020/0089047 A1    Mar. 19, 2020

(30) Foreign Application Priority Data

Sep. 14, 2018  (KR) .................... 10-2018-0110456

(51) Int. Cl.
*G02F 1/1335*   (2006.01)
*G02F 1/13357*  (2006.01)
(Continued)

(52) U.S. Cl.
CPC ...... *G02F 1/133516* (2013.01); *G02F 1/1336* (2013.01); *G02F 1/133512* (2013.01);
(Continued)

(58) Field of Classification Search
CPC ............. G02F 2/02; G02F 2001/01791; G02F 1/133512; H01L 33/50; H01L 33/507; H05B 33/145
See application file for complete search history.

(56) References Cited

U.S. PATENT DOCUMENTS

| 10,090,335 B2 | 10/2018 | Kang et al. |
| 2007/0077349 A1* | 4/2007 | Newman ............. H01L 51/5212 427/66 |

(Continued)

FOREIGN PATENT DOCUMENTS

| KR | 1020170003297 A | 1/2017 |
| KR | 1020170099011 A | 8/2017 |

(Continued)

*Primary Examiner* — Michael H Caley
*Assistant Examiner* — Jonathan Y Jung
(74) *Attorney, Agent, or Firm* — Cantor Colburn LLP

(57) ABSTRACT

A color filter includes a substrate including pixel areas and a light-shielding area which is disposed between adjacent pixels areas; and a color conversion layer which color-converts incident light of an incident color and emits color-converted light toward the substrate, the color conversion layer including a first color conversion pattern in a first pixel area among the pixel areas and with which the incident light of the incident color is converted into light of a first color; and a second color conversion pattern in a second pixel area among the pixel areas and with which the incident light of the incident color is converted into light of a second color; and a partition wall in the light-shielding area and between the first color conversion pattern and the second color conversion pattern, the partition wall including a light-scattering material which scatters light incident thereto.

20 Claims, 10 Drawing Sheets

(51) Int. Cl.
  *H01L 27/32* (2006.01)
  *G02F 2/02* (2006.01)
  *H05B 33/14* (2006.01)
  G02F 1/017 (2006.01)
  H01L 33/50 (2010.01)
  G02F 1/1333 (2006.01)

(52) U.S. Cl.
  CPC ............ *H01L 27/322* (2013.01); *G02F 1/017* (2013.01); *G02F 1/01791* (2021.01); *G02F 1/133357* (2021.01); *G02F 2/02* (2013.01); *H01L 33/50* (2013.01); *H01L 33/507* (2013.01); *H05B 33/145* (2013.01)

(56) References Cited

U.S. PATENT DOCUMENTS

| | | | |
|---|---|---|---|
| 2007/0200492 A1* | 8/2007 | Cok | H01L 51/5284 313/506 |
| 2015/0048348 A1* | 2/2015 | Huang | H01L 51/5284 257/40 |
| 2015/0077966 A1* | 3/2015 | Bessho | F21V 5/002 362/19 |
| 2017/0005293 A1 | 1/2017 | Kim et al. | |
| 2017/0062674 A1* | 3/2017 | Kwon | H01L 25/0753 |
| 2018/0045866 A1 | 2/2018 | Chae et al. | |
| 2018/0059485 A1 | 3/2018 | Nam et al. | |
| 2018/0356688 A1* | 12/2018 | Chen | G02F 1/133514 |

FOREIGN PATENT DOCUMENTS

| | | |
|---|---|---|
| KR | 1020180018945 A | 2/2018 |
| KR | 1020180025388 A | 3/2018 |
| KR | 1020180046494 A | 5/2018 |

\* cited by examiner

COLOR FILTER AND DISPLAY APPARATUS INCLUDING THE SAME

This application claims priority to Korean Patent Application No. 10-2018-0110456, filed on Sep. 14, 2018, and all the benefits accruing therefrom under 35 U.S.C. § 119, the disclosure of which is incorporated herein in its entirety by reference.

BACKGROUND

1. Field

One or more embodiments relate to a color filter and a display apparatus including the same.

2. Description of the Related Art

A liquid crystal display ("LCD") apparatus uses a color filter to form a color image. The LCD apparatus has low light efficiency since the amount of white light emitted from a backlight source is reduced to about ⅓ after the white light passes through red, green, and blue color filters.

SUMMARY

One or more embodiments include a display apparatus having improved color reproducibility and improved light efficiency.

Additional features will be set forth in part in the description which follows and, in part, will be apparent from the description, or may be learned by practice of the presented embodiments.

According to one or more embodiments, a color filter includes: a substrate from which light is emitted from the color filter, the substrate including a plurality of pixel areas and a light-shielding area which is disposed between adjacent pixels areas among the plurality of pixel areas; a color conversion layer which color-converts incident light of an incident color and emits color-converted light toward the substrate, the color conversion layer including: a first color conversion pattern in a first pixel area among the plurality of pixel areas and with which the incident light of the incident color is converted into light of a first color; and a second color conversion pattern in a second pixel area among the plurality of pixel areas and with which the incident light of the incident color is converted into light of a second color; and a partition wall in the light-shielding area and between the first color conversion pattern and the second color conversion pattern, the partition wall including a light-scattering material which scatters light incident thereto.

The first color conversion pattern may include first quantum dots which are excited by the incident light and emit the light of the first color, and the second color conversion pattern may include second quantum dots which are excited by the incident light and emit the light of the second color.

The color filter may further include: a light-shielding layer between the substrate and the partition wall; a first color filter pattern which is between the substrate and the first color conversion pattern and selectively transmits the light of the first color emitted from the first color conversion pattern; and a second color filter pattern which is between the substrate and the second color conversion pattern and selectively transmits the light of the second color emitted from the second color conversion pattern.

The color filter may further include a transmission layer which is in a third pixel area spaced apart from the first pixel area and the second pixel area from among the plurality of pixel areas and transmits the incident light.

The partition wall may be between the transmission layer and the first color conversion pattern and between the transmission layer and the second color conversion pattern.

The color filter may further include: a light-shielding layer between the substrate and the partition wall; a first color filter pattern which is between the substrate and the first color conversion pattern and selectively transmits the light of the first color emitted from the first color conversion pattern; a second color filter pattern which is between the substrate and the second color conversion pattern and selectively transmits the light of the second color emitted from the second color conversion pattern; and a third color filter layer which is between the substrate and the transmission layer and selectively transmits the incident light emitted from the transmission layer.

The incident light may be light of a third color having a wavelength shorter than a wavelength of each of the light of the first color and the light of the second color.

The incident light may be blue light, and the first color and the second color may be respectively red and green.

A thickness of the partition wall may be equal to or greater than a thickness of each of the first and second color conversion patterns.

According to one or more embodiments, a display apparatus includes: a display panel at which incident light of an incident color is emitted from the display panel; and a color filter in which the incident light of the incident color emitted from the display panel is color-converted and from which color-converted light is emitted, the color filter including: a first substrate from which the color-converted light is emitted from the color filter, the first substrate including a plurality of pixel areas respectively corresponding to the plurality of pixels of the display panel and a light-shielding area which is disposed between adjacent pixel areas; a color conversion layer which color-converts the incident light of the incident color and emits the color-converted light, the color conversion layer including: a first color conversion pattern in a first pixel area among the plurality of pixel areas and with which the incident light of the incident color is converted into light of a first color; and a second color conversion pattern in a second pixel area of the plurality of pixel areas and with which the incident light of the incident color is converted into light of a second color; and a first partition wall in the light-shielding area and between the first color conversion pattern and the second color conversion pattern, the first partition wall including a light-scattering material which scatters light incident thereto.

A thickness of the first partition wall may be equal to or greater than a thickness of each of the first and second color conversion patterns.

The display panel may include: a second substrate on which the plurality of pixels are arranged; and a thin-film encapsulation layer on the second substrate.

The display apparatus may further include a planarizing layer between the thin-film encapsulation layer and the color filter.

A thickness of the first partition wall may be equal to or less than a sum of a thickness of each of the first and second color conversion patterns, and a thickness of the planarizing layer, respectively.

The display apparatus may further include a second partition wall on the thin-film encapsulation layer to correspond to the light-shielding area.

The first partition wall and the second partition wall may contact each other.

According to one or more embodiments, a display apparatus includes: a display panel including a plurality of pixels at which incident light of an incident color is emitted from the display panel; a first substrate on which the plurality of pixels are arranged; and a thin-film encapsulation layer on the first substrate; and a color filter in which the incident light of the incident color emitted from the display panel is color-converted and from which color-converted light is emitted, the color filter including: a second substrate from which the color-converted light is emitted from the color filter, the second substrate including: a plurality of pixel areas respectively corresponding to the plurality of pixels of the display panel, and a light-shielding area which is disposed between adjacent pixel areas respectively corresponding to adjacent pixels of the display panel; and a color conversion layer including a plurality of color conversion patterns respectively in the plurality of pixel areas; and a light blocking member corresponding to the light shielding area of the color filter, a portion of the light blocking member disposed closer to the display panel than the color conversion layer of the color filter.

The light blocking member corresponding to the light shielding area of the color filter is disposed within the color filter as a first partition wall between adjacent color conversion patterns and including a light-scattering material, and the first partition wall protrudes further than each of the adjacent color conversion patterns to dispose a portion of the first partition wall closer to the display panel than the adjacent color conversion patterns.

The light blocking member corresponding to the light shielding area of the color filter is disposed outside of the color filter as a second partition wall protruding from the thin-film encapsulation layer and toward the color filter, and the second partition wall is disposed closer to the display panel than the plurality of color conversion patterns.

The light blocking member corresponding to the light shielding area of the color filter includes: a first partition wall within the color filter, the first partition wall disposed between adjacent color conversion patterns and including a light-scattering material, and a second partition wall outside the color filter, the second partition wall protruding from the thin-film encapsulation layer and toward the color filter, and the first partition wall and the second partition wall contact each other in the light-shielding area.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
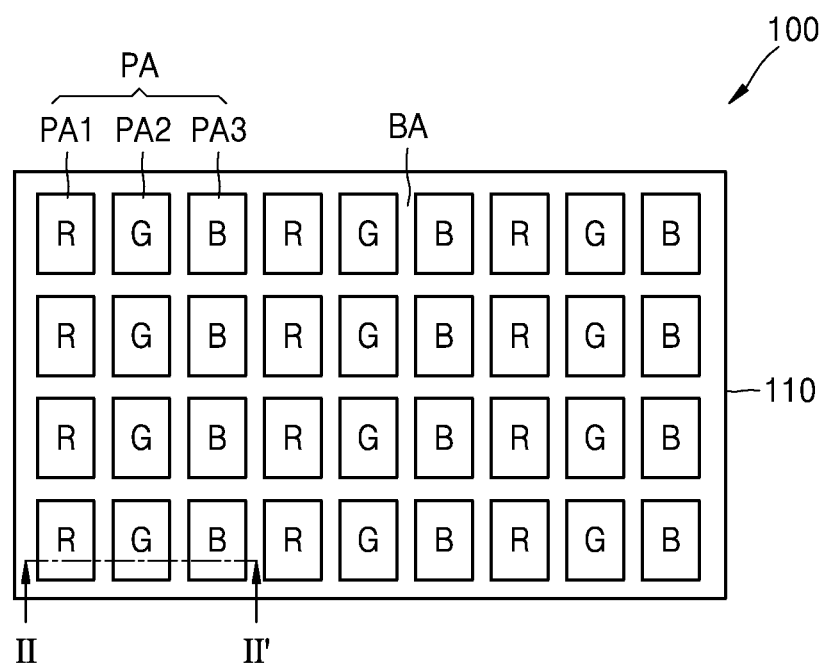
FIG. 1 is a top plan view of an embodiment of a color filter according to the invention.

The present disclosure may include various embodiments and modifications, and embodiments thereof will be illustrated in the drawings and will be described herein in detail. The advantages and features of the present disclosure and methods of achieving the advantages and features will be described more fully with reference to the accompanying drawings, in which embodiments are shown. The present disclosure may, however, be embodied in many different forms and should not be construed as being limited to the embodiments set forth herein.

Reference will now be made in detail to embodiments, examples of which are illustrated in the accompanying drawings. Parts in the drawings unrelated to the detailed description are omitted to ensure clarity of the present disclosure. In the drawings, the same elements are denoted by the same reference numerals, and a repeated explanation thereof will not be given.

It will be understood that when a layer, region, or element is referred to as being related to another element such as being "on" another layer, region, or element, it may be directly on the other layer, region, or element, or intervening layers, regions, or elements may be present. In contrast, when a layer, region, or element is referred to as being related to another element such as being "directly on" another layer, region, or element, no intervening layers, regions, or elements are present.

Sizes of elements may be exaggerated for convenience of explanation. In other words, since sizes and thicknesses of elements in the drawings are arbitrarily illustrated for convenience of explanation, the following embodiments are not limited thereto.

It will be understood that when a layer, region, or element is referred to as being related to another element such as being "connected" the layer, region, or element may be directly connected or may be indirectly connected with intervening layers, regions, or elements therebetween. For example, when a layer, region, or element is electrically connected, the layer, region, or element may be directly electrically connected or may be indirectly electrically connected with intervening layers, regions, or elements therebetween.

When a certain embodiment may be implemented differently, a specific process order may be different from the described order. For example, two consecutively described processes may be performed substantially at the same time or performed in an order opposite to the described order It will be understood that although the terms "first," "second," etc. may be used herein to describe various components, these components should not be limited by these terms. These components are only used to distinguish one component from another.

As used herein, the singular forms "a," "an, and "the" are intended to include the plural forms as well, unless the context clearly indicates otherwise. Throughout the specification, when a portion "includes" or "comprises" an element, another element may be further included, rather than excluding the existence of the other element, unless otherwise described.

As used herein, the term "and/or" includes any and all combinations of one or more of the associated listed items. Expressions such as "at least one" when preceding a list of elements, modify the entire list of elements and do not modify the individual elements of the list.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Since a liquid crystal display ("LCD") apparatus in which a color filter is used has relatively low light efficiency and color reproducibility, a photo-luminescent LCD ("PL-LCD") apparatus is proposed which uses a quantum dot color conversion layer ("QD-CCL"). The PL-LCD apparatus displays a color image by using visible light in a relatively low wavelength band such as ultraviolet (UV) light or blue light which are generated by a light source and controlled by a liquid crystal layer, to be emitted to a CCL.

Figure 2:
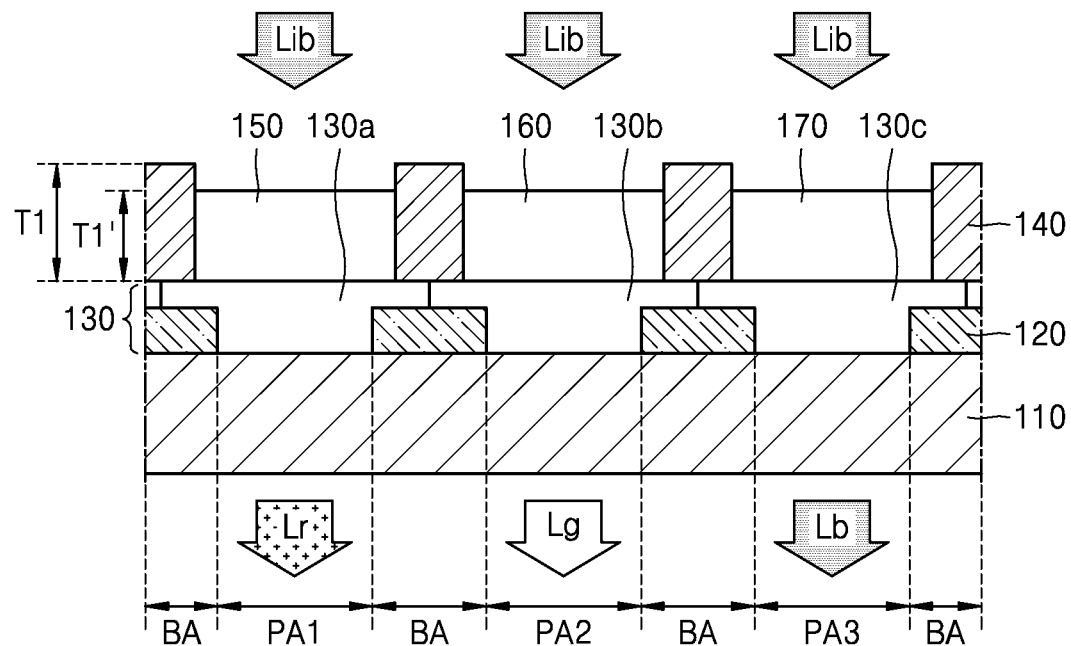
FIGS. 2 and 3 are enlarged cross-sectional views of respective embodiments of the color filter of FIG. 1 taken along line 11-11'.
Figure 3:
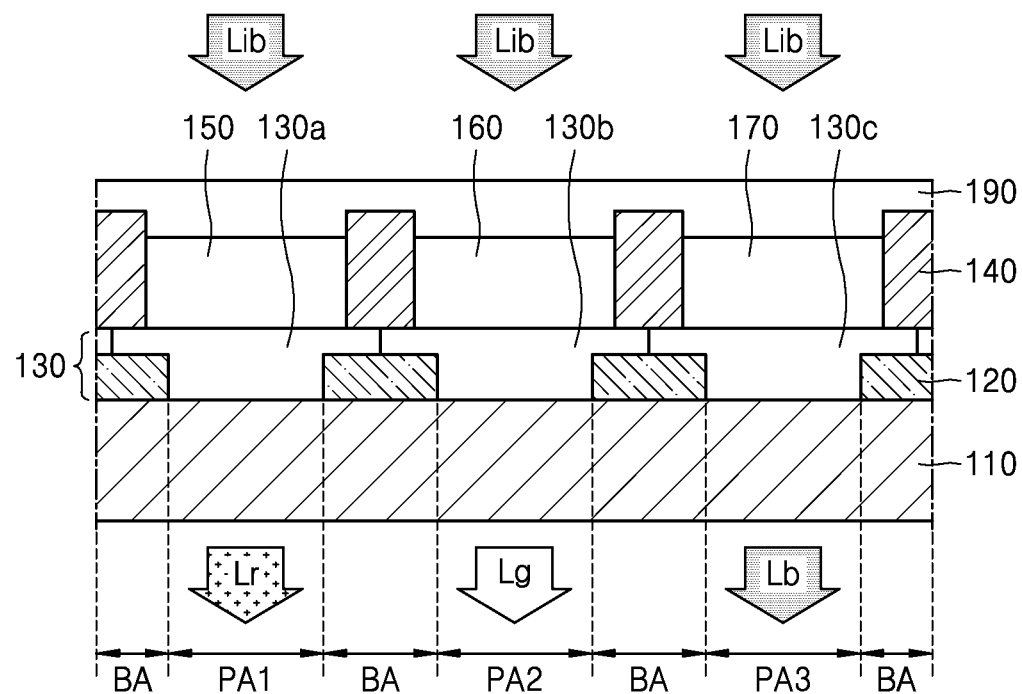

FIG. 1 is a top plan view of an embodiment of a color filter 100 according to the invention. FIGS. 2 and 3 are enlarged cross-sectional views of respective embodiments of the color filter 100 taken along line II-II' of FIG. 1.

The color filter 100 may include a substrate 110, a first partition wall 140, a first color conversion layer 150, and a second color conversion layer 160. The substrate 110 may comprise pixel areas and a light-shielding area between adjacent pixel areas. The first partition wall 140 may be in the light-shielding area and may comprise a material that scatters and/or reflects a light. The first color conversion layer 150 and the second color conversion layer 160 may be in the pixel areas.

Referring to FIGS. 1 and 2, the color filter 100 may include a substrate 110, a light-shielding layer 120, a color filter layer 130, a first partition wall 140, a first color conversion layer 150, and a second color conversion layer 160.

The color filter 100 and components thereof may be disposed or arranged in a plane defined by first and second directions which cross each other. In FIG. 1, for example, the horizontal direction may be one of the first and second directions while the vertical direction is the other one of the first and second directions. A thickness of the color filter 100 and components thereof may extend along a third direction which crosses each of the first and second directions. In FIG. 1, for example, a thickness of the color filter 100 extends into the page view. For FIGS. 2 and 3, a vertical direction represents a thickness of the color filter 100 and layers thereof while a horizontal direction represents one of the first and second directions. A direction into the page view of FIGS. 2 and 3 represents the other one of the first and second directions.

The substrate 110 may include or define a first pixel area PA1 and a second pixel area PA2 that are spaced apart from each other, and a light-shielding area BA located between the first and second pixel areas PA1 and PA2. The first color conversion layer 150 is located in (e.g., corresponds to) the first pixel area PA1 and converts incident light Lib into light Lr of a first color. The second color conversion layer 160 may be located in (e.g., corresponds to) the second pixel area PA2 and may convert the incident light Lib into light Lg of a second color.

The color filter 100 may further include a transmission layer 170. The substrate 110 may further include a third pixel area PA3 spaced apart from the first and second pixel areas PA1 and PA2. The transmission layer 170 may be located in (e.g., corresponds to) the third pixel area PA3 and may transmit the incident light Lib as light Lb of a third color.

The color filter 100 may receive the incident light Lib and may emit the light Lr of the first color, the light Lg of the second color, and the light Lb of the third color. The incident light Lib may be incident to the color filter 100 through the first color conversion layer 150, the second color conversion layer 160 and the transmission layer 170. That is, these various layers form a light incident surface of the color filter 100.

Referring to FIG. 1, a pixel area PA and the light-shielding area BA are defined in the color filter 100. The pixel area PA at which light is emitted is surrounded by the light-shielding area BA. The pixel area PA may be divided into the first pixel area PA1, the second pixel area PA2, and a third pixel area PA3 according to a color of emitted light. In an embodiment, for example, the first pixel area PA1 is an area where the light Lr of the first color is emitted, the second pixel area PA2 is an area where the light Lg of the second color is emitted, and the third pixel area PA3 is an area where the light Lb of the third color is emitted. An arrangement of the first through third pixel areas PA1, PA2, and PA3 of FIG. 1 is an example, and the present disclosure is not limited thereto. The first through third pixel areas PA1, PA2, and PA3 may be arranged in any of various forms to correspond to an arrangement of pixels of a display apparatus in which the color filter 100 is disposed.

The light Lr of the first color may be red light, the light Lg of the second color may be green light, and the light Lb of the third color may be blue light. The red light is light having a peak wavelength equal to or greater than about 580 nanometers (nm) and less than about 750 nm. The green light is light having a peak wavelength equal to or greater than about 495 nm and less than about 580 nm. The blue light is light equal to or greater than about 400 nm and less than about 495 nm. The incident light Lib may be light of the third color.

The light-shielding area BA, where light is not emitted, may be arranged in a mesh pattern among the first through third pixel areas PA1, PA2, and PA3.

The substrate 110 is a transparent substrate through which the light Lr of the first color and the light Lg of the second color respectively emitted from the first and second color conversion layers 150 and 160 may be emitted through the first and second pixel areas PA1 and PA2. The light Lb of the third color may be emitted through the third pixel area PA3 of the substrate 110. That is, the substrate 110 forms a light-emitting surface of the color filter 100.

The substrate 110 may be any of typically used substrates, but may include or be formed of, for example, an insulating material such as glass, plastic, or crystal. The substrate 110 may include be formed of an organic polymer material such as polycarbonate ("PC"), polyethylene terephthalate ("PET"), polyethylene ("PE"), polypropylene ("PP"), polysulfone ("PSF"), polymethylmethacrylate ("PMMA"), triacetyl cellulose ("TAC"), cyclic olefin polymer ("COP"), or cyclic olefin copolymer ("COC"). A material of the substrate 110 may be selected considering mechanical strength, thermal stability, transparency, surface smoothness, ease of handling, and water resistance of the color filter 100 and the substrate 110 therefor.

The light-shielding layer 120 may be located in the light-shielding area BA. The light-shielding layer 120 may be formed as a relatively thin film in the light-shielding area BA. When light is emitted through the light-shielding area BA, light leakage may occur in the display apparatus. In one or more embodiment, the light-shielding layer 120 may reduce or effectively prevent light from leaking outward through the light-shielding area BA.

The light-shielding layer 120 may have of any of various colors including black or white. When the light-shielding layer 120 is black, the light-shielding layer 120 may include a black matrix. When the light-shielding layer 120 is white, the light-shielding layer 120 may include an organic insulating material such as white resin. The light-shielding layer 120 may include an opaque inorganic insulating material such as CrOx or MoOx or an opaque organic insulating material such as black resin.

The color filter layer 130 may be an organic material pattern including a dye or a pigment. The color filter layer 130 may include a first color filter layer (or pattern) 130a, a second color filter layer (or pattern) 130b, and a third color filter layer (or pattern) 130c. The first color filter layer 130a may be located in at least the first pixel area PA1, the second color filter layer 130b may be located in at least the second pixel area PA2, and the third color filter layer 130c may be located in at least the third pixel area PA3. The first color filter layer 130a may selectively transmit only light of the first color, the second color filter layer 130b may selectively transmit only light of the second color, and the third color filter layer 130c may selectively transmit only light of the third color. As such, these color filter layers may selectively block light except for the selectively transmitted color light.

The first partition wall 140 may be located in the light-shielding area BA and may be extended along the first color conversion layer 150, the second color conversion layer 160, and the transmission layer 170. The first partition wall 140 may include portions lengthwise extending along the first and/or second directions among the various conversion and transmission layers. The first partition wall 140 may overlap the light-shielding layer 120.

A height (thickness) T1 of the first partition wall 140, that is, a distance between a top surface of the color filter layer 130 and a top surface of the first partition wall 140, may be equal to or greater than a height (thickness) T1' of each of the first color conversion layer 150, the second color conversion layer 160, and the transmission layer 170. The thicknesses T1 and T1' may be a maximum dimension of the various wall and component, taken from a common reference surface, such as the top surface of the color filter layer 130. The first partition wall 140 may contact side surfaces of the first color conversion layer 150, the second color conversion layer 160, and the transmission layer 170 which are respectively adjacent to the first partition wall 140 so as to form an interface therebetween. The first partition wall 140 may absorb light at the interface respectively formed by contact thereof with the first color conversion layer 150, the second color conversion layer 160, and the transmission layer 170. For components, layers or elements shown in the drawings or described within this disclosure as contacting each other, an interface may be formed therebetween.

The first partition wall 140 may include a material that scatters and/or reflects the light Lr, Lg, and Lb of the first through third colors. The first partition wall 140 may scatter and/or reflect light incident from the first and second color conversion layers 140 and 150 and the transmission layer 170. Accordingly, the first partition wall 140 that scatters and/or reflects the light Lr, Lg, and Lb may reduce light loss caused by light absorption, as compared to a partition wall including a light-absorbing material.

The first partition wall 140 may reduce or effectively prevent each of the light Lr of the first color emitted from the first color conversion layer 150 from being emitted to the second color conversion layer 160 or the transmission layer 170, the light Lg of the second color emitted from the second color conversion layer 160 from being emitted to the first color conversion layer 150 or the transmission layer 170, and the light Lb of the third color emitted from the transmission layer 170 from being emitted to the first color conversion layer 150 or the second color conversion layer 160.

In an embodiment, for example, more than half (e.g., most) of the light Lr of the first color emitted from the first color conversion layer 150 and scattered and/or reflected by the first partition wall 140 may be incident back to the first color conversion layer 150. Even when a portion of the light Lr of the first color reflected by the first partition wall 140 is incident on the second color conversion layer 160 and/or the transmission layer 170, if more than half of the light Lr of the first color scattered and/or reflected by the first partition wall 140 is incident back in the first color conversion layer 150, this is considered to be included in the scope of the present embodiment. Similarly, most, for example, more than half, of the light Lg of the second color emitted from the second color conversion layer 160 and scattered and/or reflected by the first partition wall 140 may be incident back on the second color conversion layer 160. Likewise, even when a portion of the light Lg of the second color reflected by the first partition wall 140 is incident on the first color conversion layer 150 and/or the transmission layer 170, if more than half of the light Lg of the second color scattered and/or reflected by the first partition wall 140 is incident back on the second color conversion layer 160, this is considered to be included in the scope of the present embodiment.

In an embodiment of manufacturing a color filter, each of the first color conversion layer 150, the second color conversion layer 160, and the transmission layer 170 may be formed by using an inkjet method in a concave space defined by the first partition wall 140.

The first color conversion layer 150 is located in the first pixel area PA1 to overlap the first color filter layer 130a, converts the incident light Lib into the light Lr of the first color and emits the converted light Lr of the first color toward the substrate 110. The first color conversion layer 150 may include a material such as first quantum dots that are excited by the incident light Lib and emit the converted light Lr of the first color having a wavelength longer than a wavelength of the incident light Lib.

The second color conversion layer 160 is located in the second pixel area PA2 to overlap the second color filter layer 130b, converts the incident light Lib into the light Lg of the second color and emits the converted Lg of the second color toward the substrate 110. The second color conversion layer 160 may include a material such as second quantum dots that are excited by the incident light Lib and emit light the converted light Lg of the second color having a wavelength longer than the wavelength of the incident light Lib.

The transmission layer 170 is located in the third pixel area PA3 to overlap the third color filter layer 130c, transmits the light Lb of the third color and emits the light Lb of the third color toward the substrate 110. The transmission layer 170 may not color-convert the incident light Lib such that the emitted light Lb is essentially the incident light Lib.

In an embodiment, as shown in FIG. 3, the color filter 100 may further include a planarization layer 190 that is commonly located on the first and second color conversion layers 150 and 160 and the transmission layer 170 and has a flat top surface. The planarization layer 190 may be located on the substrate 110 to cover the first and second color conversion layers 150 and 160 and the transmission layer 170. That is, the planarization layer 190 forms a light incident surface of the color filter 100. The planarization layer 190 may be transparent so that the incident light Lib is transmitted therethrough without color conversion and subsequently emitted to be incident to the first and second color conversion layers 150 and 160 and the transmission layer 170.

The planarization layer 190 may include or be formed of a transparent organic material such as polyimide resin, acrylic resin, or a resist material. In an embodiment of manufacturing a color filter, the planarization layer 190 may be formed by using a wet process such as slit coating or spin coating or a dry process such as chemical vapor deposition or vacuum deposition. The present embodiment is not limited to the above materials and the above forming methods. It would be understood that the planarization layer 190 may be omitted as shown in FIG. 2.

Figure 4:
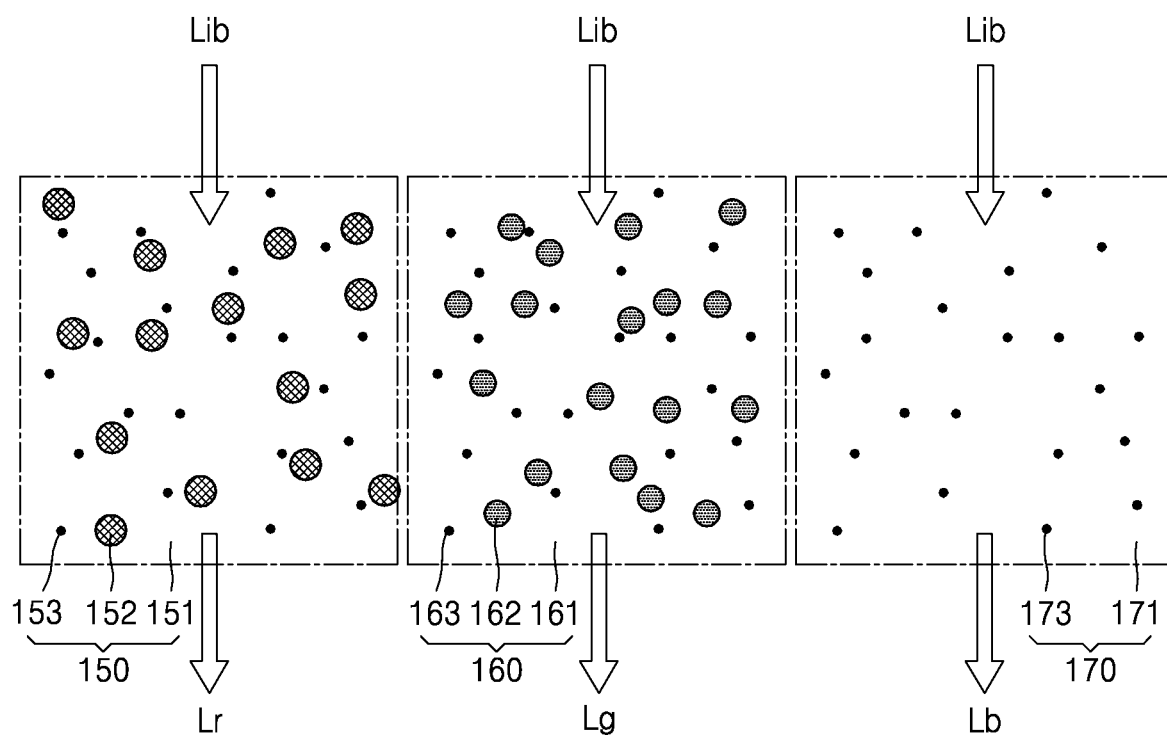
FIG. 4 is an enlarged cross-sectional view illustrating an embodiment of first and second color conversion layers and a transmission layer of a color filter according to the invention.

FIG. 4 is an enlarged cross-sectional view illustrating an embodiment of the first and second color conversion layers 150 and 160 and the transmission layer 170 of the color filter 100 according to the invention.

Referring to FIG. 4, the first color conversion layer 150 converts the incident light Lib, which is blue incident light, into the light Lr of the first color. The first color conversion layer 150 may include a first photosensitive polymer (base) 151 in which a first quantum dot 152 provided in plurality and a first scattering particle 153 provided in plurality are dispersed.

The first quantum dots 152 may be excited by the incident light Lib and may isotropically emit the light Lr of the first color having a wavelength longer than a wavelength of blue light. The first photosensitive polymer 151 may be an organic material having light-transmitting properties. The first scattering particles 153 may excite more first quantum dots 152 by scattering the incident light Lib that is not absorbed by the first quantum dots 152, thereby increasing a color conversion rate of the first color conversion layer 150. The first scattering particles 153 may include, for example, a material such as titanium oxide ($TiO_2$) or metal particles. The first quantum dots 152 may include a group II-VI compound, a group III-V compound, a group IV-VI compound, a group IV compound, or a combination thereof.

The second color conversion layer 160 converts the incident light Lib into the light Lg of the second color. The second color conversion layer 160 may include a second photosensitive polymer (base) 161 in which a second quantum dot 162 provided in plurality and a second scattering particle 163 provided in plurality are dispersed.

The second quantum dots 162 may be excited by the incident light Lib and may isotropically emit the light Lg of the second color having a wavelength longer than a wavelength of blue light. The second photosensitive polymer 161 that is an organic material having light-transmitting properties may be the same material as the first photosensitive polymer 151. The second scattering particles 163 excite more second quantum dots 162 by scattering the incident light Lib that is not absorbed by the second quantum dots 162, thereby increasing a color conversion rate of the second color conversion layer 160. The second scattering particles 163 may include, for example, titanium oxide ($TiO_2$) or metal particles, and may be the same material as the first scattering particles 153. The second quantum dots 162 may include a group II-VI compound, a group III-V compound, a group IV-VI compound, a group IV compound, or a combination thereof. The second quantum dots 162 may be the same material as the first quantum dots 152, and in this case, sizes of the second quantum dots 162 may be less than sizes of the first quantum dots 152.

The transmission layer 170 may transmit the incident light Lib without color conversion thereof and may emit the incident light Lib toward the substrate 110. The transmission layer 170 may include a third photosensitive polymer (base) 171 in which third scattering particles 173 are dispersed. The third photosensitive polymer 171 may be an organic material having light-transmitting properties such as silicon resin or epoxy resin, and may be the same as the first and second photosensitive polymers 151 and 161. The third scattering particles 173 may scatter and emit the incident light Lib, and may be the same as the first and second scattering particles 153 and 163.

FIGS. 5A through 5D are cross-sectional views for describing an embodiment of a process of manufacturing the color filter 100 according to the invention.

Figure 5A:
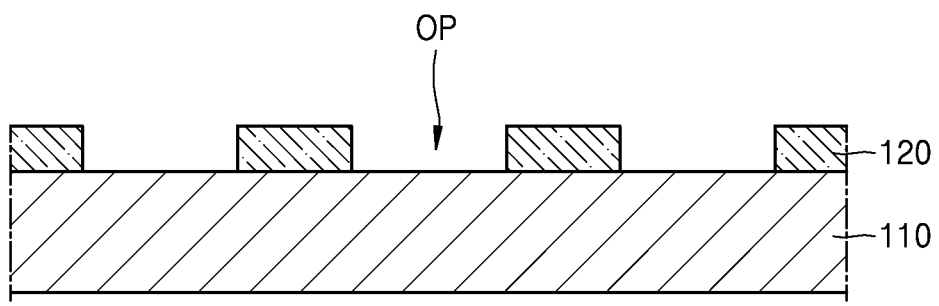
FIGS. 5A through 5D are cross-sectional views for describing an embodiment of a process of manufacturing a color filter according to the invention.

Referring to FIG. 5A, the light-shielding layer 120 may be formed in the light-shielding area BA on the substrate 110. The light-shielding layer 120 may be formed by spraying organic ink, or may be formed by patterning a metal layer through a photolithographic process. Accordingly, an opening OP may be formed in the light-shielding layer 120. The opening OP exposes a top surface of the substrate 110. The light-shielding layer 120 may define a plurality of the opening OP along the top surface of the substrate 110.

Figure 5B:
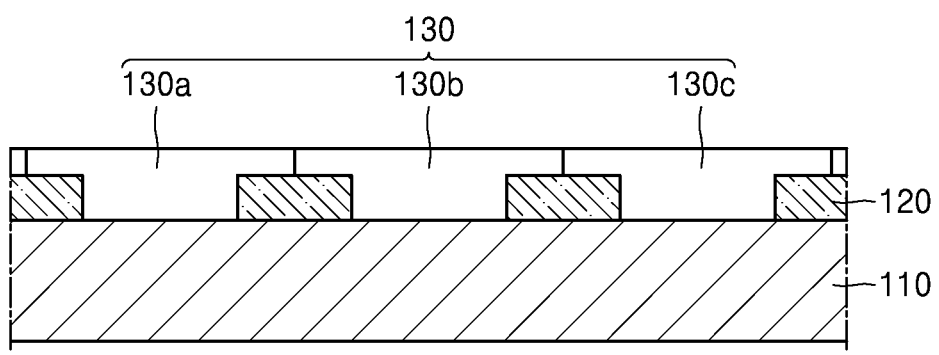

Referring to FIG. 5B, the color filter layer 130 may be formed on the substrate 110 having the light-shielding layer 120 thereon. Portions or patterns of the color filter layer 130 may be formed in a respective opening OP of the light-shielding layer 120.

The overall color filter layer 130 may be formed by repeatedly performing a process of coating a color photoresist material on the substrate 110 and performing selective patterning. In an embodiment, for example, the first color filter layer 130a may be formed by coating and etching a first color photoresist material, the second color filter layer 130b may be formed by coating and etching a second color photoresist material, and the third color filter layer 130c may be formed by coating and etching a third color photoresist material. An order of forming the first through third color filter layers 130a through 130c is not limited thereto.

Each color photoresist material may include a photopolymerizable photosensitive material such as a photopolymerization initiator, a monomer or a binder, and an organic pigment for expressing color. The first color filter layer 130a, the second color filter layer 130b, and the third color filter layer 130c may be formed as, for example, a stripe type or a mosaic type in the top plan view, according to an arrangement method. The color filter layer 130 may extend from the opening OP to be disposed on a top surface of a respective portion of the light-shielding layer 120. Top surfaces of the patterns within the color filter layer 130 may be coplanar with each other without being limited thereto.

Although the overall color filter layer 130 has a minimum height (thickness) that is greater than a maximum height (thickness) of the light-shielding layer 120 in FIG. 5B, the present embodiment is not limited thereto, and, for example, the color filter layer 130 may be formed to have a height (thickness) that is equal to or less than a height (thickness) of the light-shielding layer 120. The heights and thicknesses may be referenced from a common surface, such as the top surface of the substrate 110 and a virtual extension of the top surface thereof.

Figure 5C:
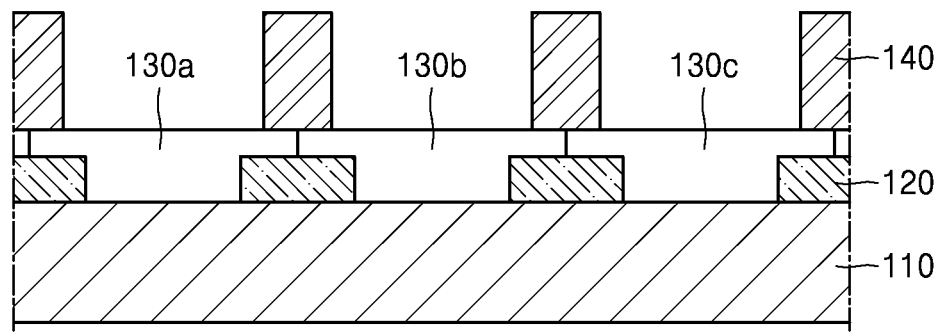

Referring to FIG. 5C, the first partition wall 140 may be formed in the light-shielding area BA on the substrate 110 having the color filter layer 130 thereon. The first partition wall 140 may be formed by coating a first partition wall-forming material on the substrate 110 and performing patterning of the first partition wall-forming material. The first partition wall 140 may be formed of a material for scattering and/or reflecting the light Lr of the first color, the light Lg of the second color, and the light Lb of the third color. The first partition wall 140 may have a single or multi-layer structure. A height (thickness) of the first partition wall 140 and the density of a scattering material and/or a reflective material may vary according to an applied electronic apparatus in which the color filter 100 is disposed.

The first partition wall 140 defines spaces between portions thereof. An upper surface of the color filter layer 130 is exposed at the spaces.

Figure 5D:
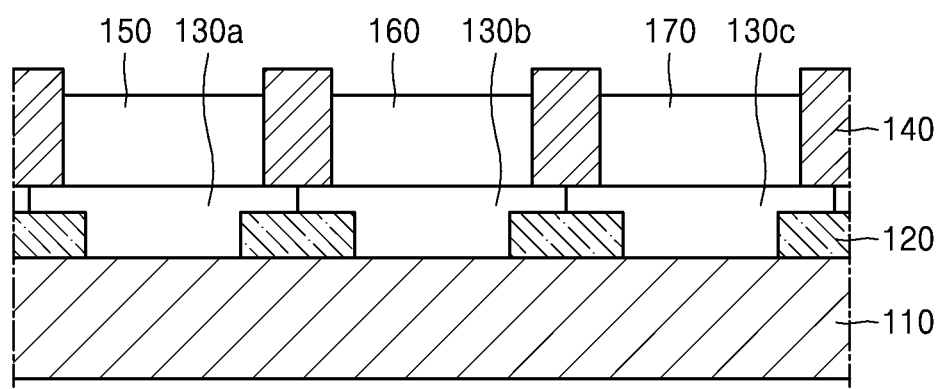

Referring to FIG. 5D, the first color conversion layer 150, the second color conversion layer 160, and the transmission layer 170 may be formed in respective spaces defined by the first partition wall 140. The layers 150, 160 and 170 may collectively be referred to as a color-conversion layer.

In an embodiment, the first color conversion layer 150 may be formed in the first pixel area PA1 by coating a first quantum dot-photoresist material on the substrate 110 and performing patterning of the first quantum dot-photoresist material. The second color conversion layer 160 may be formed in the second pixel area PA2 by coating a second quantum dot-photoresist material on the substrate 110 and performing patterning of the second quantum dot-photoresist material. The transmission layer 170 may be formed in the third pixel area PA3 by coating a third photoresist material on the substrate 110 and performing patterning of the third photoresist material. An order of forming the first and second color conversion layers 150 and 160 and the transmission layer 170 is not limited thereto.

In another embodiment, the first color conversion layer 150, the second color conversion layer 160, and the transmission layer 170 may be formed by using inkjet coating where a material (e.g., ink) is deposited on the substrate 110 at a respective space in the first partition wall 140. A height of the first partition wall 140 may be designed so that when the first color conversion layer 150, the second color conversion layer 160, and the transmission layer 170 are formed by using inkjet coating, a material for forming each of the first color conversion layer 150, the second color conversion layer 160, and the transmission layer 170 does not flow to an adjacent pixel area. Since the first color conversion layer 150, the second color conversion layer 160, and the transmission layer 170 are formed by using inkjet coating, a photo process may not be added, manufacturing costs may be reduced, and a process may be simplified.

Figure 6:
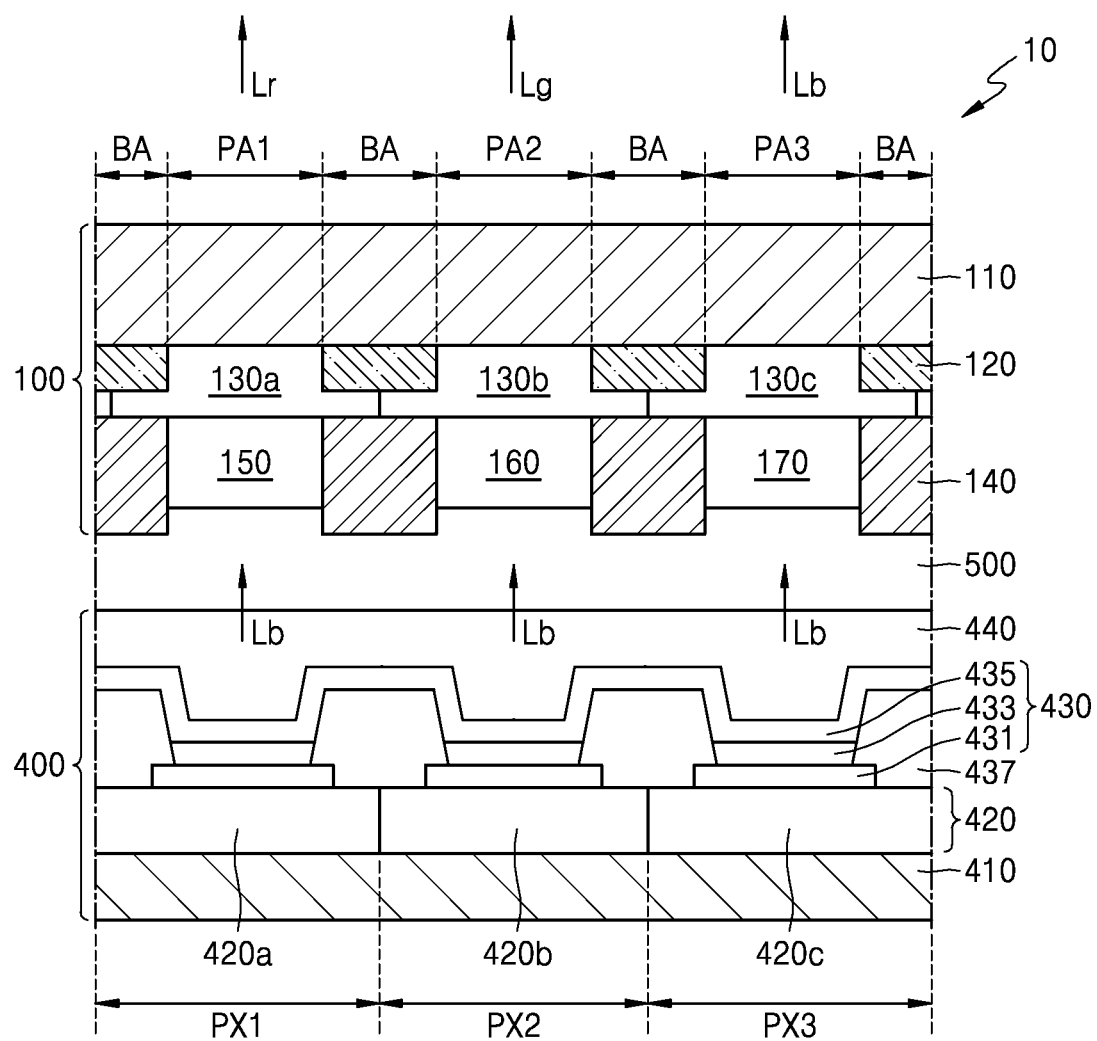
FIGS. 6 through 10 are cross-sectional views illustrating respective embodiments display apparatuses according to the invention.

FIG. 6 is a cross-sectional view illustrating a structure of an embodiment of a display apparatus 10 according to the invention.

Referring to FIG. 6, the display apparatus 10 may include a display panel 400 and the color filter 100. A filling layer 500 may be further provided between the display panel 400 and the color filter 100. The filling layer 500 may be an air layer or an insulating layer including a transparent material. The filling layer 500 may planarize a surface of the color filter 100 which faces the display panel 400.

The display panel 400 may include first through third pixels PX1, PX2, and PX3. The first pixel PX1 may include a (first) light-emitting device 430 and a first pixel circuit 420a for controlling the (first) light-emitting device 430, the second pixel PX2 may include a (second) light-emitting device 430 and a second pixel circuit 420b for controlling the (second) light-emitting device 430, and the third pixel PX3 may include a (third) light-emitting device 430 and a third pixel circuit 420c for controlling the (third) light-emitting device 430.

Each light-emitting device 430 may be an organic light-emitting device ("OLED"). The light-emitting device 430 may emit the light Lb of the third color, for example, blue light Lb, of which an amount thereof is controlled by each of the first through third pixel circuits 420a, 420b, and 420c. The light-emitting devices 430 may be located to correspond to the pixel areas PA of the color filter 100. The first through third pixel circuits 420a, 420b, and 420c may be located in a pixel circuit layer 420 located under the light-emitting devices 430, and may at least partially overlap or may not overlap the light-emitting devices 430.

The color filter 100 may emit outward the light Lr of the first color and the light Lg of the second color after converting colors of a portion of the light Lb of the third color emitted from the light-emitting devices 430, and may emit outward a portion of the light Lb of the third color without color conversion.

A substrate 410 may include or be formed of a material such as glass, a metal, or an organic material.

The first through third pixel circuits 420a, 420b, and 420c of the first through third pixels PX1, PX2, and PX3, respectively, may be located on the substrate 410. Each of the first through third pixel circuits 420a, 420b, and 420c may include a plurality of thin-film transistors ("TFTs") and at least one capacitor. Conductive signal lines and conductive power lines for transmitting signals and a driving voltage, respectively, applied to the first through third pixels PX1, PX2, and PX3 in addition to the first through third pixel circuits 420a, 420b, and 420c may be located in the pixel circuit layer 420.

The light-emitting device 430 of the first pixel PX1 may be located to correspond to the first pixel area PA1 of the color filter 100. The light-emitting device 430 of the second pixel PX2 may be located to correspond to the second pixel area PA2 of the color filter 100. The light-emitting device 430 of the third pixel PX3 may be located to correspond to the third pixel area PA3 of the color filter 100.

Each of the TFTs as a switching element may include a semiconductor layer, a gate electrode, a source electrode and a drain electrode. The semiconductor layer may include amorphous silicon or polycrystalline silicon. The semiconductor layer may include an oxide semiconductor. The semiconductor layer may include a source region, a drain region, and a channel region between the source region and the drain region.

The light-emitting devices 430 may be provided on the pixel circuit layer 420. Each of the light-emitting devices 430 may include a pixel electrode 431, an intermediate layer 433, and a counter electrode 435.

The pixel electrode 431 may be connected to the source electrode or the drain electrode of the TFT. The pixel electrode 431 may be exposed through an opening of a pixel-defining film 437, and an edge of the pixel electrode 431 may be covered by the pixel-defining film 437.

The intermediate layer 433 may be located on a portion of the pixel electrode 431 exposed at an opening defined in the pixel-defining film 437. The intermediate layer 433 may include an organic emission layer, and the organic emission layer may include or be formed of a relatively low-molecular-weight organic material or a relatively high-molecular-weight organic material. The intermediate layer 433 may further selectively include functional layers such as a hole transport layer ("HTL"), a hole injection layer ("HIL"), an electron transport layer ("ETL"), and an electron injection layer ("EIL") in addition to the organic emission layer.

The counter electrode 435 may be located to commonly cover the intermediate layer 433 and the pixel-defining film 437. The counter electrode 435 may include a transparent or semi-transparent electrode. In an embodiment, for example, the counter electrode 435 may include or be formed of a metal thin film having a relatively small work function. The counter electrode 435 may include a transparent conductive material layer including or formed of transparent conductive oxide ("TCO").

A thin-film encapsulation layer 440 may be located on the light-emitting devices 430. The thin-film encapsulation layer 440 may cover the counter electrode 435 and may be located completely over an entirety of the substrate 410. The thin-film encapsulation layer 440 may include an inorganic material encapsulation layer formed of at least one inorganic material and an organic material encapsulation layer including at least one organic material. In an embodiment, the thin-film encapsulation layer 440 may have a structure in which a first inorganic material encapsulation layer, an organic material encapsulation layer, and a second inorganic encapsulation layer are stacked.

The color filter 100 may include the substrate 110, the light-shielding layer 120, and the first partition wall 140 for partitioning the first through third pixel areas PA1, PA2, and PA3 for different colors, and the first through third color filter layers 130a, 130b, and 130c for selectively transmitting different colors.

The first color conversion layer 150 for converting the blue light Lb into the red light Lr may be located in the first pixel area PA1, the second color conversion layer 160 for converting the blue light Lb into the green light Lg may be located in the second pixel area PA2, and the transmission layer 170 for transmitting the blue light Lb may be located in the third pixel area PA3.

The light Lb of the third color emitted from the light-emitting device 430 controlled by the first pixel circuit 420a of the first pixel PX1 is converted into the light Lr of the first color by the first color conversion layer 150 and is emitted outward from the display apparatus 10 through the substrate 110. The light Lb of the third color emitted from the light-emitting device 430 controlled by the second pixel circuit 420b of the second pixel PX2 is converted into the light Lg of the second color by the second color conversion layer 160 and is emitted outward from the display apparatus 10 through the substrate 110. The light Lb of the third color emitted from the light-emitting device 430 controlled by the third pixel circuit 420c of the third pixel PX3 is emitted outward from the display apparatus 10 through the substrate 110 without color conversion by the transmission layer 170.

The blue light Lb emitted from the display panel 400 is incident on the color filter 100 and is converted into the red light Lr, the green light Lg, and the blue light Lb, to display a color image.

Since color mixing is reduced or effectively prevented by blocking light introduced between adjacent transmission layers and adjacent color conversion layers due to the first partition wall 140, color matching and color reproducibility may be improved, light efficiency may be improved, and thus power consumption may be reduced.

Figure 7:
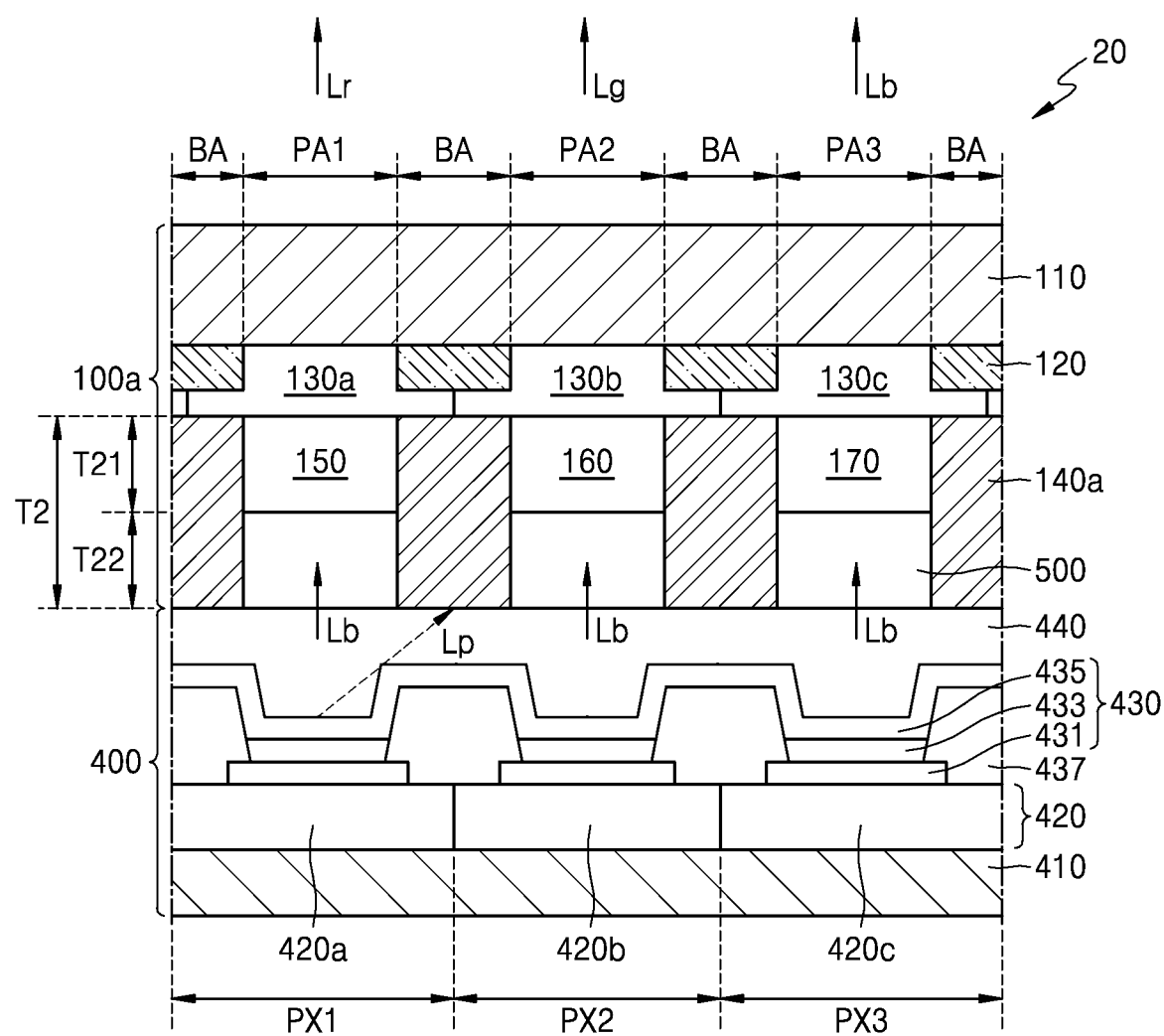

FIG. 7 is a cross-sectional view illustrating a structure of another embodiment of a display apparatus 20 according to the invention.

Referring to FIG. 7, the display apparatus 20 may include the display panel 400 and a color filter 100a. The display apparatus 20 of FIG. 7 is different from the display apparatus 10 of FIG. 6 in that a first partition wall 140a extends to a top surface of the thin-film encapsulation layer 440 and through the filling layer 500 to space apart portions thereof. The same element as that described with reference to FIG. 6 will not be described.

A total height (thickness) T2 of the first partition wall 140a may be greater or less than a sum of a height (thickness) T21 of each of the first color conversion layer 150, the second color conversion layer 160, and the transmission layer 170 and a thickness T22 of the filling layer 500. In an embodiment, the total height (thickness) T2 of the first partition wall 140a may be equal to or less than a sum of the height (thickness) T21 and the height (thickness) T22. The thickness T22 of the filling layer 500 may be a distance respectively between a top surface of each of the first color conversion layer 150, the second color conversion layer 160, and the transmission layer 170, and a top surface of the thin-film encapsulation layer 440.

The first partition wall 140a may be located between adjacent color conversion layers and transmission layers, respectively, and may block light introduced between the adjacent color conversion layers and transmission layers. Also, since the first partition wall 140a partitions the first through third pixel areas PA, PA2, and PA3 at the filling layer 500, the first partition wall 140a may reduce or effectively prevent a portion Lp of light emitted from the light-emitting device 430 in one pixel area from being transmitted through the filling layer 500 and being incident on a color conversion layer or a transmission layer of an adjacent pixel area. Accordingly, color mixing between pixel areas may be blocked, color matching and color reproducibility may be improved, light efficiency may be improved, and thus power consumption may be reduced.

Figure 8:
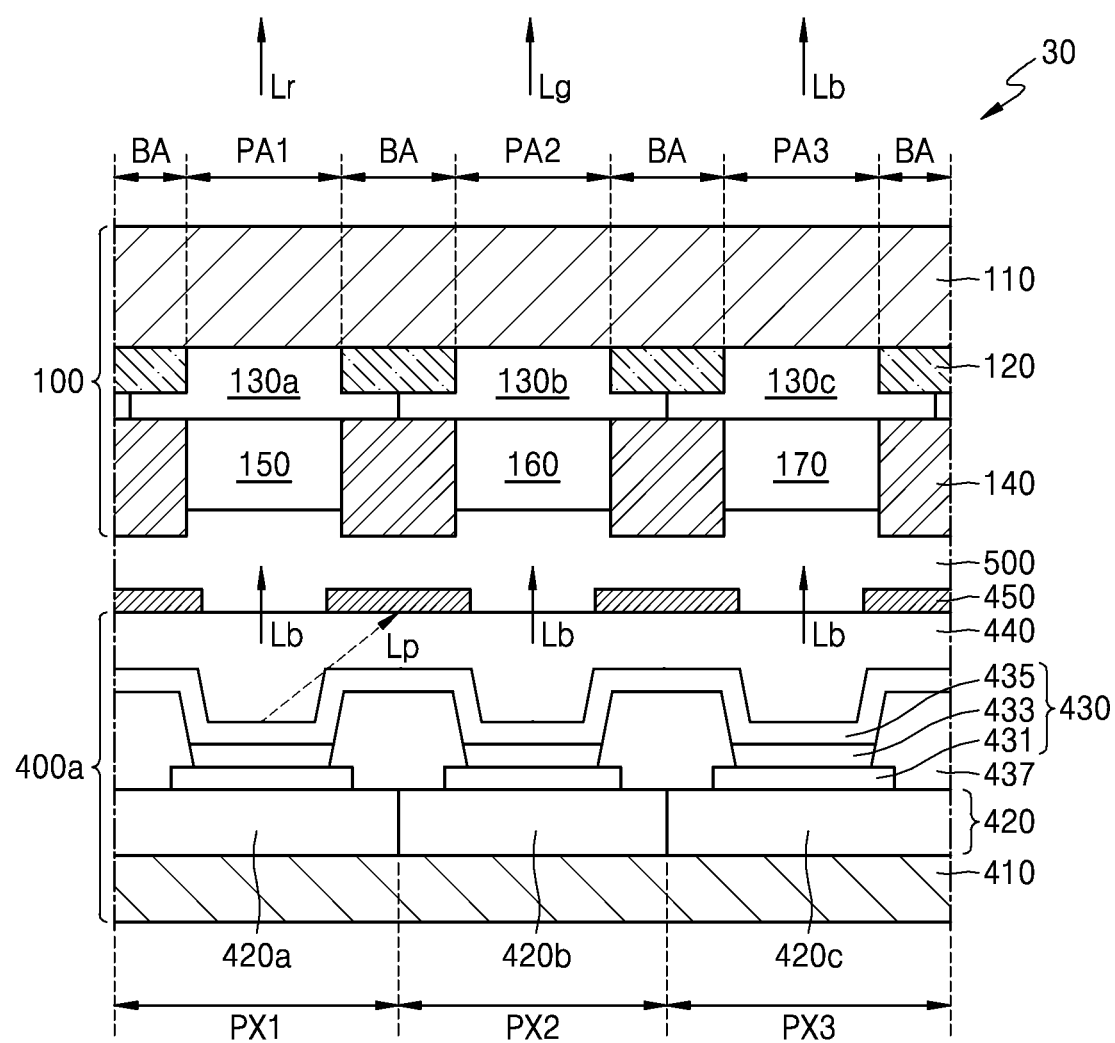

FIG. 8 is a cross-sectional view illustrating a structure of still another embodiment of a display apparatus 30 according to the invention.

Referring to FIG. 8, the display apparatus 30 may include a display panel 400a and the color filter 100. The display apparatus 30 of FIG. 8 is different from the display apparatus 10 of FIG. 6 in that a second partition wall 450 is provided on the thin-film encapsulation layer 440. The same element as that described with reference to FIG. 6 will not be described. For convenience of description, the second partition wall 450 may be considered a portion of the display panel 400a, or a portion of the display apparatus 30 which is separate from each of the color filter 100 and the display panel 400a of the display apparatus 30.

The display apparatus 30 may include the first partition wall 140 of the color filter 100 and the second partition wall 450 located on the thin-film encapsulation layer 440. The first partition wall 140 and the second partition wall 450 may be located to correspond to the light-shielding area BA.

Since the first partition wall 140 is located between color conversion layers and transmission layers, respectively, the first partition wall 140 may reduce or effectively prevent color mixing by blocking light introduced between the color conversion layers and the transmission layers.

Since the second partition wall 450 partitions the first through third pixel areas PA1, PA2, and PA3 at the filling layer 500, the second partition wall 450 may reduce or effectively prevent a portion Lp of light emitted (Lb+Lp) from the light-emitting device 430 of one pixel area from passing through the thin-film encapsulation layer 440 and the filling layer 500 and being incident on a color conversion layer or a transmission layer of an adjacent pixel area. Light emitted at a relatively high angle, for example, an angle of about 60° to about 80°, relative to a top surface of the substrate 410 from among light emitted by the light-emitting device 430 of one pixel area may pass through the thin-film encapsulation layer 440 and the filling layer 500 and may be incident on a color conversion layer and/or a transmission layer of an adjacent pixel area. The second partition wall 450 may absorb, reflect, and/or scatter light of a relatively high-angle component of the light-emitting device 430 and may reduce or effectively prevent the light from being incident on a color conversion layer and/or a transmission layer of an adjacent pixel area. Accordingly, color mixing between pixel areas may be reduced or effectively prevented, color matching and color reproducibility may be improved, light efficiency may be improved, and thus power consumption may be reduced.

The second partition wall 450 may include a material that absorbs at least a portion of light incident thereto, a light reflecting material, or a light scattering material. The second partition wall 450 may include a black matrix. The second partition wall 450 may include an opaque inorganic insulating material such as CrOx or MoOx or an opaque organic insulating material such as black resin. The second partition wall 450 may include a layer having a relatively high light reflectance, for example, a metal layer. The metal layer may be a layer including or formed of silver (Ag), magnesium (Mg), aluminum (Al), platinum (Pt), palladium (Pd), gold (Au), nickel (Ni), neodymium (Nd), iridium (Ir), chromium (Cr), an alloy thereof, or a compound thereof. In an embodiment, for example, the second partition wall 450 may include a layer including or formed of Ag. The second partition wall 450 may have a multi-layer structure in which a plurality of layers are continuously stacked. At least one of the continuously stacked layers may include a metal layer. In an embodiment, for example, the second partition wall 450 may include a transparent metal oxide material layer such as an indium tin oxide ("ITO") layer and an Ag layer. In an embodiment, the second partition wall 450 may include a first transparent metal oxide material layer, an Ag layer, and a second transparent metal oxide material layer that are continuously stacked. In an embodiment of manufacturing a display apparatus, the second partition wall 450 may be formed by forming a partition wall-forming material on the thin-film encapsulation layer 440 and performing patterning of the partition wall-forming material.

Figure 9:
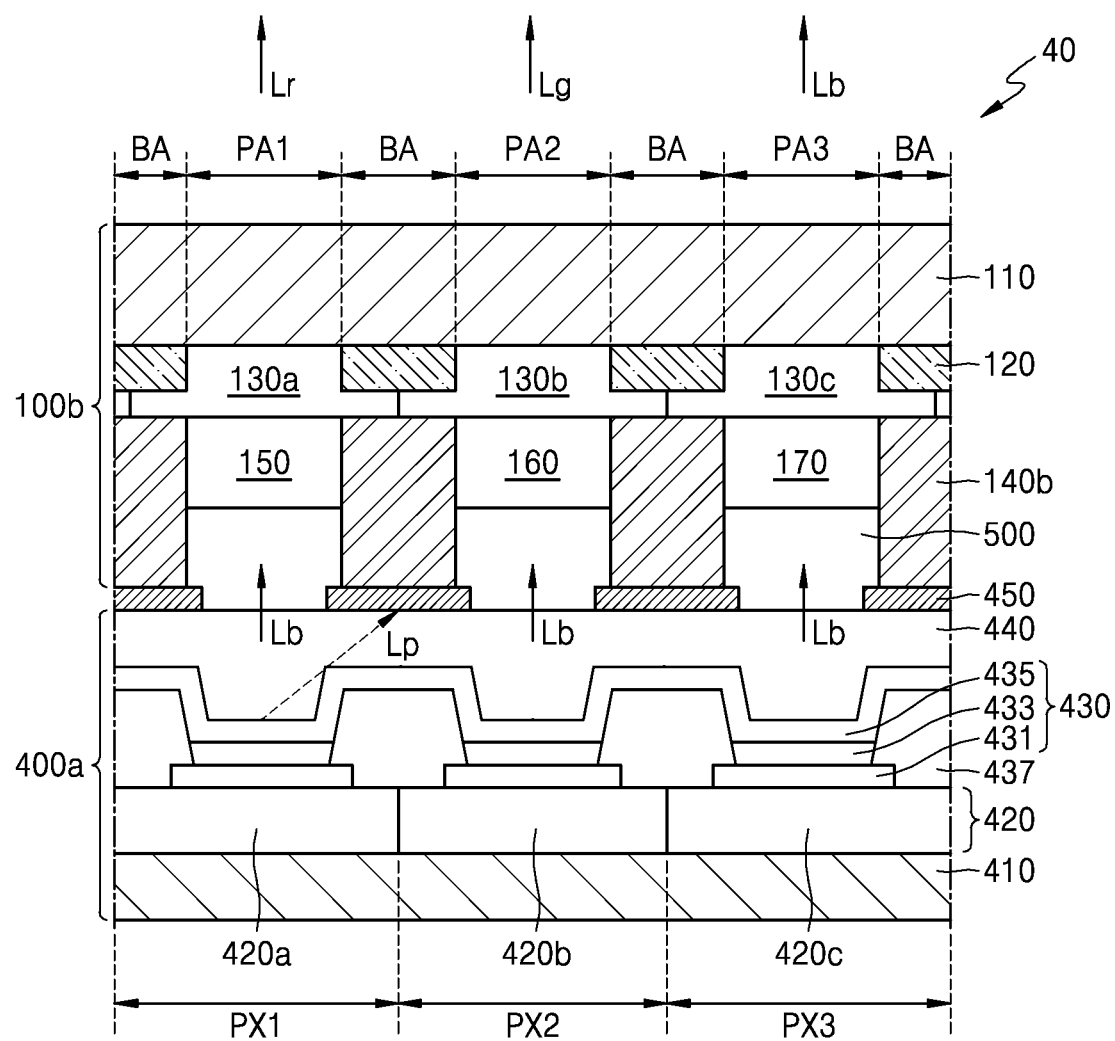

FIG. 9 is a cross-sectional view illustrating a structure of yet another embodiment of a display apparatus 40 according to another embodiment.

Referring to FIG. 9, the display apparatus 40 may include the display panel 400a and a color filter 100b. The display apparatus 40 of FIG. 9 is different from the display apparatus 30 of FIG. 8 in that a first partition wall 140b and the second partition wall 450 contact each other. The same element as that described with reference to FIGS. 6 and 8 will not be described.

The display apparatus 40 may include the first partition wall 140b of the color filter 100b and the second partition wall 450 located on the thin-film encapsulation layer 440. The first partition wall 140b and the second partition wall 450 may be located to correspond to the light-shielding area BA.

The first partition wall 140b may have a height (thickness) large enough to contact the second partition wall 450 provided on a top surface of the thin-film encapsulation layer 440. A total height (thickness) of the first partition wall 140b may be less than a sum of a respective height (thickness) of each of the first color conversion layer 150, the second color conversion layer 160, and the transmission layer 170, and a thickness of the filling layer 500. A thickness of the filling layer 500 may be a distance respective between a top surface of each of the first color conversion layer 150, the second color conversion layer 160, and the transmission layer 170, and the top surface of the thin-film encapsulation layer 440.

The first partition wall 140b may be located between color conversion layers and transmission layers, respectively, and may reduce or effectively prevent color mixing by blocking light introduced between the color conversion layers and the transmission layers. Also, since the first partition wall 140b partitions the first through third pixel areas PA1, PA2, and PA3 at the filling layer 500 along with the second partition wall 450, the first partition wall 140b may reduce or effectively prevent a portion Lp of light emitted (Lb+Lp) from the light-emitting device 430 at one pixel area from passing through the filling layer 500 and being incident on a color conversion layer or a transmission layer of an adjacent pixel area.

Accordingly, color mixing between pixel areas may be reduced or effectively prevented, color matching and color reproducibility may be improved, light efficiency may be improved, and thus power consumption may be reduced.

Figure 10:
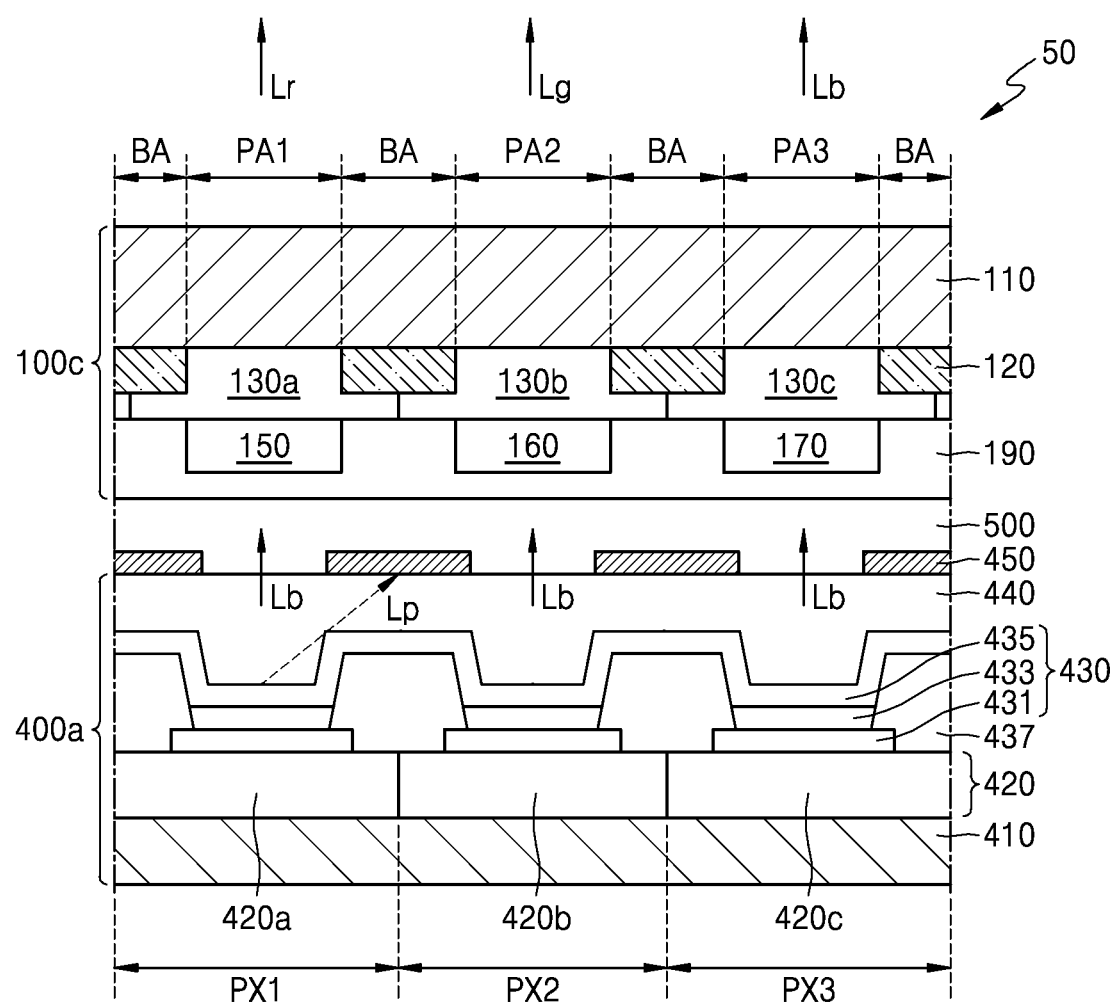

FIG. 10 is a cross-sectional view illustrating a structure of yet another embodiment of a display apparatus 50 according to the invention.

Referring to FIG. 10, the display apparatus 50 may include the display panel 400a and a color filter 100c. The display apparatus 50 of FIG. 10 is different from the display apparatus 30 of FIG. 8 in that only the second partition wall 450 is provided among portions of a partition wall (400+

450) provided in the display apparatus 30 of FIG. 8. The same element as that described with reference to FIGS. 6 and 8 will not be described.

The color filter 100c may include the light-shielding layer 120 for partitioning the first through third pixel areas PA1, PA2, and PA3 for different colors and the first through third color filter layers 130a, 130b, and 130c for selectively transmitting different colors. The color filter 100c is an example obtained by omitting the first partition wall 140 of FIG. 6. The color filter 100c may further include the planarization layer 190 located on the first and second color conversion layers 150 and 160 and the transmission layer 170 and having a flat top surface. The planarization layer 190 and the filling layer 500 may together define a planarizing layer which is common to the color filter 100c and the display panel 400a.

The display apparatus 50 may include the second partition wall 450 located on the thin-film encapsulation layer 440. The second partition wall 450 may be located to correspond to the light-shielding area BA. Since the second partition wall 450 partitions the first through the third pixel areas PA1, PA2, and PA3 at the filling layer 500, the second partition wall 450 may reduce or effectively prevent a portion Lp of light emitted (Lb+Lp) from the light-emitting device 430 at one pixel area from passing through the filling layer 500 and being incident on a color conversion layer or a transmission layer of an adjacent pixel area. Accordingly, color mixing between pixel areas may be reduced or effectively prevented, color matching and color reproducibility may be improved, light efficiency may be improved, and thus power consumption may be reduced.

Since in a conventional color filter, the color conversion layer does not transmit a portion of light emitted from a light source, like a color filter, and generates light having a different wavelength from the light emitted from the light source, light emitted from the color conversion layer is emitted in various directions. Also, a portion of the light emitted from the light source may pass through the color conversion layer without being converted. Accordingly, light of a first color emitted from one color conversion layer, light of a second color emitted by a color conversion layer adjacent to the one color conversion layer, or light of a third color emitted from the light source may be undesirably mixed, thereby leading to color mixing. As a result, color reproducibility may be reduced.

Display apparatuses according to one or more embodiment may include a first partition wall that is located in a light-shielding area respectively between color conversion layers and transmission layers of a color filter, and functions as a first blocking member for blocking light introduced between color conversion layers and transmission layers of adjacent pixel areas. The display apparatuses according to one or more embodiment may include a second partition wall that is located on a thin-film encapsulation layer of a display panel corresponding to the light-shielding area and the first partition wall, and functions a second blocking member for blocking light introduced from light-emitting devices of adjacent pixel areas. The display apparatuses according to one or more embodiment may reduce or effectively prevent color mixing between adjacent pixel areas by including at least one of the first partition wall and the second partition wall. Color matching, color reproducibility, and light efficiency of light emitted through the display apparatuses may be controlled by adjusting at least one of a thickness of the first partition wall and/or a thickness of the second partition wall, and the density of a scattering material and/or a reflective material.

According to various embodiments, since color mixing between adjacent pixels may be reduced or effectively prevented due to a partition wall respectively between adjacent color conversion layers and transmission layers and/or a partition wall on a thin-film encapsulation layer, a display apparatus having a relatively simple structure and improved color reproducibility may be provided.

While one or more embodiments have been described with reference to the figures, it will be understood by one of ordinary skill in the art that various changes in form and details may be made therein without departing from the spirit and scope as defined by the following claims.

What is claimed is:
1. A color filter comprising:
   a substrate comprising a plurality of pixel areas and a light-shielding area which is disposed between adjacent pixel areas among the plurality of pixel areas;
   a color conversion layer which converts incident light of an incident color and emits color-converted light toward the substrate, the color conversion layer comprising:
      a first color conversion pattern in a first pixel area among the plurality of pixel areas and with which the incident light of the incident color is converted into light of a first color; and
      a second color conversion pattern in a second pixel area among the plurality of pixel areas and with which the incident light of the incident color is converted into light of a second color; and
   a partition wall in the light-shielding area and between the first color conversion pattern and the second color conversion pattern,
   wherein the partition wall extends from between the first color conversion pattern and the second color conversion pattern and away from the substrate and comprises a light-scattering material which scatters light incident thereto.

2. The color filter of claim 1, wherein within the color conversion layer:
   the first color conversion pattern comprises first quantum dots which are excited by the incident light of the incident color and emit the light of the first color, and
   the second color conversion pattern comprises second quantum dots which are excited by the incident light of the incident color and emit the light of the second color.

3. The color filter of claim 1, further comprising:
   a light-shielding layer between the substrate and the partition wall, the light-shielding layer corresponding to the light-shielding area of the substrate; and
   a color filter layer between the substrate and the color conversion layer, the color filter layer comprising:
      a first color filter pattern which corresponds to the first color conversion pattern and selectively transmits the light of the first color emitted from the first color conversion pattern; and
      a second color filter pattern which corresponds to the second color conversion pattern and selectively transmits the light of the second color emitted from the second color conversion pattern.

4. The color filter of claim 1, wherein the color conversion layer further comprises a transmission layer in a third pixel area spaced apart from the first pixel area and the second pixel area from among the plurality of pixel areas and through which the incident light of the incident color is transmitted.

5. The color filter of claim 4, wherein the partition wall is between the transmission layer and the first color conversion pattern and between the transmission layer and the second color conversion pattern.

6. The color filter of claim 4, further comprising:
a light-shielding layer between the substrate and the partition wall, the light-shielding layer corresponding to the light-shielding area of the substrate;
a color filter layer between the substrate and the color conversion layer, the color filter layer comprising:
a first color filter pattern which corresponds to the first color conversion pattern and selectively transmits the light of the first color emitted from the first color conversion pattern;
a second color filter pattern which corresponds to the second color conversion pattern and selectively transmits the light of the second color emitted from the second color conversion pattern; and
a third color filter pattern which corresponds to the transmission layer and transmits the incident light of the incident color emitted from the transmission layer.

7. The color filter of claim 1, wherein the incident color of the incident light is a third color having a wavelength shorter than each of a wavelength of the light of the first color and a wavelength of the light of the second color.

8. The color filter of claim 1, wherein
the incident light is blue light, and
the first color and the second color are respectively red and green.

9. The color filter of claim 1, wherein a thickness of the partition wall is equal to or greater than each of a thickness of the first color conversion pattern and a thickness of the second color conversion pattern.

10. A display apparatus comprising:
a display panel comprising a plurality of pixels from which incident light of an incident color is emitted; and
a color filter in which the incident light of the incident color emitted from the display panel is color-converted and from which color-converted light is emitted, the color filter comprising:
a first substrate comprising a plurality of pixel areas respectively corresponding to the plurality of pixels of the display panel and a light-shielding area which is disposed between adjacent pixel areas;
a color conversion layer which converts the incident light of the incident color and emits the color-converted light, the color conversion layer comprising:
a first color conversion pattern in a first pixel area among the plurality of pixel areas and with which the incident light of the incident color is converted into light of a first color; and
a second color conversion pattern in a second pixel area of the plurality of pixel areas and with which the incident light of the incident color is converted into light of a second color;
a first partition wall in the light-shielding area and between the first color conversion pattern and the second color conversion pattern, the first partition wall comprising a light-scattering material which scatters light incident thereto; and
a second partition wall between the display panel from which the incident light of the incident color is emitted and the color filter, the second partition wall corresponding to the first partition wall which includes the light-scattering material.

11. The display apparatus of claim 10, wherein within the color filter, a thickness of the first partition wall is equal to or greater than each of a thickness of the first color conversion pattern and a thickness of the second color conversion pattern.

12. The display apparatus of claim 10, wherein the display panel comprises:
a second substrate on which the plurality of pixels are arranged; and
a thin-film encapsulation layer on the second substrate.

13. The display apparatus of claim 12, further comprising a planarizing layer between the thin-film encapsulation layer of the display panel and the color filter.

14. The display apparatus of claim 13, wherein a thickness of the first partition wall of the color filter is equal to or less than each of:
a sum of a thickness of the first color conversion pattern and a thickness of the planarizing layer, and
a sum of a thickness of the second color conversion pattern and the thickness of the planarizing layer.

15. The display apparatus of claim 12, wherein the second partition wall is between the thin-film encapsulation layer of the display panel and the color filter.

16. The display apparatus of claim 15, wherein the first partition wall of the color filter and the second partition wall between the thin-film encapsulation layer and the color filter contact each other.

17. A display apparatus comprising:
a display panel comprising:
a plurality of pixels from which incident light of an incident color is emitted;
a first substrate on which the plurality of pixels are arranged; and
a thin-film encapsulation layer on the first substrate; and
a color filter in which the incident light of the incident color emitted from the display panel is color-converted and from which color-converted light is emitted, the color filter comprising:
a second substrate comprising:
a plurality of pixel areas respectively corresponding to the plurality of pixels of the display panel, and
a light-shielding area which is disposed between adjacent pixel areas respectively corresponding to adjacent pixels of the display panel; and
a color conversion layer comprising a plurality of color conversion patterns respectively in the plurality of pixel areas, wherein the color conversion layer converts the incident light of the incident color and emits the color-converted light toward the second substrate, and
a light blocking member corresponding to the light shielding area of the color filter, the light blocking member comprising:
a light-shielding layer and a first partition wall within the color filter, the first partition wall disposed between adjacent color conversion patterns, and
a second partition wall between the thin-film encapsulation layer of the display panel and the color filter,
wherein each of the first partition wall and the second partition wall are spaced apart from the light-shielding layer along a direction from the display panel to the color filter.

18. The display apparatus of claim 17, wherein the first partition comprise a light-scattering material.

19. The display apparatus of claim 18, wherein the first partition wall protrudes further than each of the adjacent color conversion patterns and a height of the first partition wall from a surface of the second substrate is higher than those of the adjacent color conversion patterns from the surface of the second substrate.

20. The display apparatus of claim 17, wherein the first partition wall and the second partition wall contact each other.

\* \* \* \* \*